US009614028B2

(12) United States Patent
Blanchard

(10) Patent No.: US 9,614,028 B2
(45) Date of Patent: *Apr. 4, 2017

(54) STRUCTURES AND METHODS WITH REDUCED SENSITIVITY TO SURFACE CHARGE

(71) Applicant: Ideal Power Inc., Austin, TX (US)

(72) Inventor: Richard A. Blanchard, Los Altos, CA (US)

(73) Assignee: Ideal Power, Inc., Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/997,284

(22) Filed: Jan. 15, 2016

(65) Prior Publication Data

US 2016/0133694 A1 May 12, 2016

Related U.S. Application Data

(63) Continuation of application No. 14/599,191, filed on Jan. 16, 2015, now Pat. No. 9,337,262.
(Continued)

(51) Int. Cl.
*H01L 29/06* (2006.01)
*H01L 29/08* (2006.01)
(Continued)

(52) U.S. Cl.
CPC ...... *H01L 29/0619* (2013.01); *H01L 29/0615* (2013.01); *H01L 29/0661* (2013.01);
(Continued)

(58) Field of Classification Search
CPC .................................................. H03K 17/66
See application file for complete search history.

(56) References Cited

U.S. PATENT DOCUMENTS 6,605,830 B1    8/2003  Kusunoki
9,136,371 B2 *  9/2015  Ryu ................... H01L 29/7811
(Continued)

FOREIGN PATENT DOCUMENTS

JP    2010123667 A    6/2010
WO   2012149195 A1   11/2012

OTHER PUBLICATIONS

Trajkovic et al., "The effect of static and dynamic parasitic charge in the termination area of high voltage devices and possible solutions", The 12th International Symposium on Power Semiconductor Devices and ICs, Proceedings, pp. 263-266, May 22-25, 2000, IEEE.
(Continued)

*Primary Examiner* — Victor A Mandala
*Assistant Examiner* — Regan J Rundio
(74) *Attorney, Agent, or Firm* — Groover & Associates PLLC; Gwendolyn G. Corcoran; Roberto O. Groover, III

(57) ABSTRACT

The present application provides (in addition to more broadly applicable inventions) improvements which are particularly applicable to two-sided power semiconductor devices which use bipolar conduction. In this class of devices, the inventor has realized that two or three of the four (or more) semiconductor doping components which form the carrier-emission structures and control structures in the active device (array) portion of a two-sided power device can also be used, with surprising advantages, to form field-limiting rings around the active arrays on both surfaces. Most preferably, in some but not necessarily all embodiments, a shallow implant of one conductivity type is used to counterdope the surface of a well having the other conductivity type. This shallow implant, singly or in combination with another shallow implant of the same conductivity type, works to shield the well from the effects of
(Continued)

excess charge at or above the surface of the semiconductor material.

13 Claims, 9 Drawing Sheets

Related U.S. Application Data

(60) Provisional application No. 61/928,133, filed on Jan. 16, 2014, provisional application No. 62/094,415, filed on Dec. 19, 2014, provisional application No. 62/102,357, filed on Jan. 12, 2015.

(51) Int. Cl.
*H01L 29/10* (2006.01)
*H01L 29/73* (2006.01)
*H01L 29/732* (2006.01)
*H01L 29/40* (2006.01)
*H03K 17/66* (2006.01)
*H01L 29/739* (2006.01)
*H01L 29/72* (2006.01)
*H01L 29/735* (2006.01)
*H01L 29/747* (2006.01)

(52) U.S. Cl.
CPC ...... *H01L 29/0692* (2013.01); *H01L 29/0804* (2013.01); *H01L 29/0821* (2013.01); *H01L 29/1004* (2013.01); *H01L 29/402* (2013.01); *H01L 29/404* (2013.01); *H01L 29/72* (2013.01); *H01L 29/73* (2013.01); *H01L 29/732* (2013.01); *H01L 29/7393* (2013.01); *H01L 29/7397* (2013.01); *H03K 17/66* (2013.01); *H01L 29/735* (2013.01); *H01L 29/747* (2013.01)

(56) References Cited

U.S. PATENT DOCUMENTS

2002/0060330 A1   5/2002   Onishi et al.
2011/0291241 A1  12/2011   Yoshikawa et al.

OTHER PUBLICATIONS

International Search Report for PCT/US15/11827, KIPO, May 22, 2015.
Written Opinion of the International Searching Authority for PCT/US15/11827, KIPO, May 22, 2015.

* cited by examiner

STRUCTURES AND METHODS WITH REDUCED SENSITIVITY TO SURFACE CHARGE

CROSS-REFERENCE

Priority is claimed from 61/928,133 filed Jan. 16, 2014, which is hereby incorporated by reference.

Priority is also claimed from 62/094,415 filed Dec. 19, 2014, which is hereby incorporated by reference.

Priority is also claimed from 62/102,357 filed Jan. 12, 2015, which is hereby incorporated by reference.

BACKGROUND

The present application relates to high-voltage semiconductor devices, and more particularly to termination regions for high-voltage semiconductor devices.

Note that the points discussed below may reflect the hindsight gained from the disclosed inventions, and are not necessarily admitted to be prior art.

The design of the edge termination structure of a high voltage semiconductor device is crucial to its long-term operation. A termination structure that has been designed to operate in a given set of conditions may exhibit a considerable reduction in voltage handling ability in the presence of unwanted positive or negative charge that is at or near the surface of the termination structure.

Trajkovic et al. investigated this effect in "The effect of static and dynamic parasitic charge in the termination region of high voltage devices and possible solutions," The 12th International Symposium on Power Semiconductor Devices and ICs, Proceedings, pp. 263-266, May 22-25, 2000, IEEE, which is hereby incorporated by reference. In Trajkovic's simulations, which are reproduced here as FIGS. 9A, 9B, and 9C, when no charge was present in the oxide layer above a device, the breakdown voltage of the device was $V_{br}$=1600 V, as in FIG. 9A. When positive charge was present in the oxide layer, as in FIG. 9B, the breakdown voltage of the device was $V_{br}$=870 V. When negative charge was present in the oxide layer, as in FIG. 9C, the breakdown voltage of the device was $V_{br}$=980 V.

Commonly-owned and co-pending application Ser. No. 14/313,960, which is hereby incorporated by reference, taught novel bidirectional bipolar transistors known as B-TRANs. B-TRANs are three-layer four-terminal vertically-symmetric bidirectional bipolar transistors having at least two leads on each surface. One junction on each surface of the B-TRAN acts as an emitter, and the corresponding junction on the opposite surface acts as a collector; which side is the emitter depends on the polarity of the applied voltage.

The present application teaches, among other innovations, power semiconductor devices having reduced sensitivity to surface charge.

The present application also teaches, among other innovations, methods of operating power semiconductor devices to reduce sensitivity to surface charge.

The above innovations are implemented, in various disclosed embodiments, by replicating portions of carrier-emission structures from the active area(s) of a device in one or more field-limiting rings. The field-limiting rings can also include field plates which extend out over, and are capacitively coupled to, an adjacent annulus of dielectric. In a preferred and particularly advantageous class of embodiments, the active device is a vertically symmetric four-terminal two-surface bipolar transistor, in which current is turned on, in one direction, by driving a gate terminal near the carrier emission structure which will operate, in that direction of current, as emitter.

BRIEF DESCRIPTION OF THE DRAWINGS

The disclosed inventions will be described with reference to the accompanying drawings, which show important sample embodiments and which are incorporated in the specification hereof by reference, wherein.

DETAILED DESCRIPTION OF SAMPLE EMBODIMENTS

Figure 1:
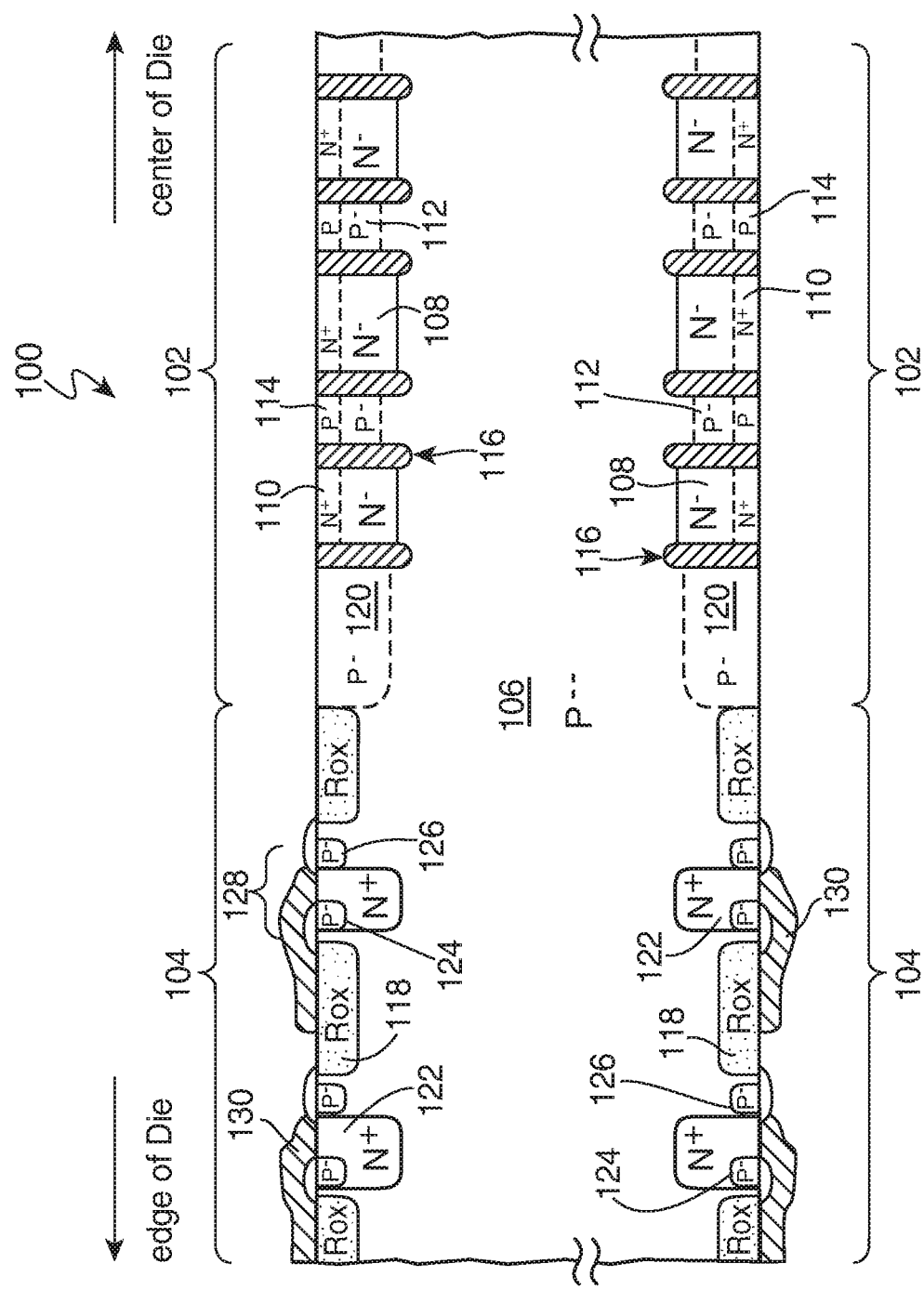
FIG. 1 shows one sample embodiment of the present inventions.

The numerous innovative teachings of the present application will be described with particular reference to presently preferred embodiments (by way of example, and not of limitation). The present application describes several inventions, and none of the statements below should be taken as limiting the claims generally.

The present application describes new approaches to the field-limiting peripheral structures which surround the active area of a power semiconductor device. Electrostatic charge at the interface between the semiconductor material (e.g. silicon) and an overlying dielectric (e.g. silicon dioxide), or even in or above the overlying dielectric, is process-dependent, and therefore somewhat unpredictable. Specifically, the polarity of this electrostatic charge is somewhat unpredictable, and nonzero charge density of either polarity is likely to degrade breakdown characteristics.

The present application provides (in addition to more broadly applicable inventions) improvements which are particularly applicable to two-sided power devices which use bipolar conduction. In this class of devices, the inventor has realized that three of the four (or more) semiconductor doping components which form the carrier-emission structures and control structures in the active device (array) portion of a two-sided power device can also be used, with surprising advantages, to form field-limiting rings around the active arrays on both surfaces.

Most preferably, in some but not necessarily all embodiments, a shallow implant of one conductivity type is used to counterdope the surface of a well having the other conductivity type, thereby simulating a shallow implant of the other conductivity type and reducing the number of implants needed in the field-limiting rings.

To implement these carrier emission structures in the field-limiting rings, a first semiconductor doping component which corresponds to the primary carrier-emitting structure (e.g. which corresponds to an n+ emitter contact region and/or an n-type emitter region), and a second doping component of opposite type, which corresponds to the contact to the primary control region (e.g. which corresponds to a p-type base contact region), are both replicated in each of a series of nested rings. In addition, the opposite-type shallow doping components can be tied together, within the field-limiting ring structure, by metal jumpers. In addition to or instead of these metallic jumpers, extensions of the metal layer(s) can also be used to form field plates, outboard or inboard of each ring, which further help to smooth the gradient of the potential.

This combination of features produces a synergistic combination of two advantages: first, a low net dopant density is achieved in sensitive surface locations, without use of additional doping steps; second, the presence of surface rings of both conductivity types helps to prevent breakdown-voltage-reducing changes in the electric field caused by different polarities and amounts of electrostatic charge.

In a p-type substrate, positive charge at an oxide-semiconductor interface can induce an electron channel at the surface of the device. Negative interfacial charge, on the other hand, can deplete the termination region surface enough to cause punch-through and device failure. When both a shallow p-type ring and a shallow n-type ring are used in the termination structure, particularly when electrically connected to each other, this can shield the deeper field-limiting ring structure from the effects of either of these failure modes.

Fabrication can be simplified in some sample embodiments by using one conductivity type to counterdope a deeper region of the opposing conductivity type, thereby simulating one of these shallow regions and reducing the number of processing steps needed to fabricate the termination structure. Instead of using the deep n-type emitter regions, the shallow n-type emitter contact regions, and the shallow p-type base contact regions of an NPN B-TRAN in its termination structures, most presently-preferred sample embodiments can eliminate the shallow n-type emitter contact regions in the termination structure. The shallow p-type base contact diffusions can instead be used to lightly counterdope a portion of the deep n-type emitter-analogue region, thereby simulating a shallow n-type region therein.

The present Figures are oriented such that the right side of each figure is closest to the center of the respective die and the left side of each figure is closest to the edge of the respective die.

In the sample embodiment of FIG. 1, active regions 102 on both sides of B-TRAN 100 include N− emitter regions 108 and N+emitter contact regions 110. Contact to P− bulk base region 106 is made through base regions 112 and corresponding base contact regions 114, both of which are preferably shallower than emitter regions 108 and emitter contact regions 110, respectively. N-type emitter regions 108 and 110 are most preferably separated from p-type base regions 112 and 114 by poly-filled trenches 116. Poly-filled trenches 116 are most preferably electrically connected to n-type source regions 110.

B-TRANs are fully bidirectional and vertically symmetric: for a given conduction direction, n-type regions 108 on one side of B-TRAN 100 act as emitter regions while those on the opposite side act as collector regions, and vice versa for the opposite direction of conduction.

P-type base contact regions 114 permit low-resistance ohmic contact to P− base regions 112. Similarly, n-type emitter contact regions 110 permit low-resistance ohmic contact to N− emitter regions 108.

P− region 120, which is preferably formed by the same diffusion as P− base regions 112, marks the transition between active region 102 and termination region 104. Termination structure 128 in termination region 104 includes deep N+field-limiting ring 122 and shallow P− rings 124 and 126.

Each adjacent pair of termination structures 128 is separated by recessed thick field oxide region 118. Metal field plate 130 is electrically connected to deep N+termination ring 122 and extends outward over a portion of thick field oxide 118, toward the edge of the die. Field plate 130 provides a constant potential above thick oxide region 118. The thickness of field oxide 118 and the distance that field plate 130 extends over field oxide 118 can be adjusted for the device parameters to further increase the breakdown voltage in the termination region.

Most preferably, deep n-type rings 122 are formed in the same diffusion as n-type emitter regions 108. Similarly, shallow p-type rings 124 and 126 are most preferably formed in the same diffusion as shallow p-type base contact regions 114.

In one sample embodiment, deep n-type rings 122 and n-type emitter regions 108 can have peak doping concentrations in the range of e.g. $10^7$-$10^{19}$/cm$^3$, and can be e.g. 2-10 μm deep. In one sample embodiment, deep n-type rings 122 and n-type emitter regions 108 are e.g. 5 μm deep.

In one sample embodiment, p-type base regions 112 can be e.g. 2-6 μm deep, and can have peak doping concentrations in the range of e.g. $10^{16}$-$10^{18}$/cm$^3$.

In one sample embodiment, n-type emitter contact regions 110 can be e.g. 0.5-1.5 μm deep, and can have peak doping concentrations of e.g. greater than $2 \times 10^{19}$/cm$^3$.

In one sample embodiment, p-type base contact regions 114 can have peak doping concentrations of e.g. greater than $10^{19}$/cm$^3$, and can be e.g. 0.2-1.0 μm deep. P-type base contact regions 114 are preferably shallower than n-type emitter contact regions 110.

Figure 3:
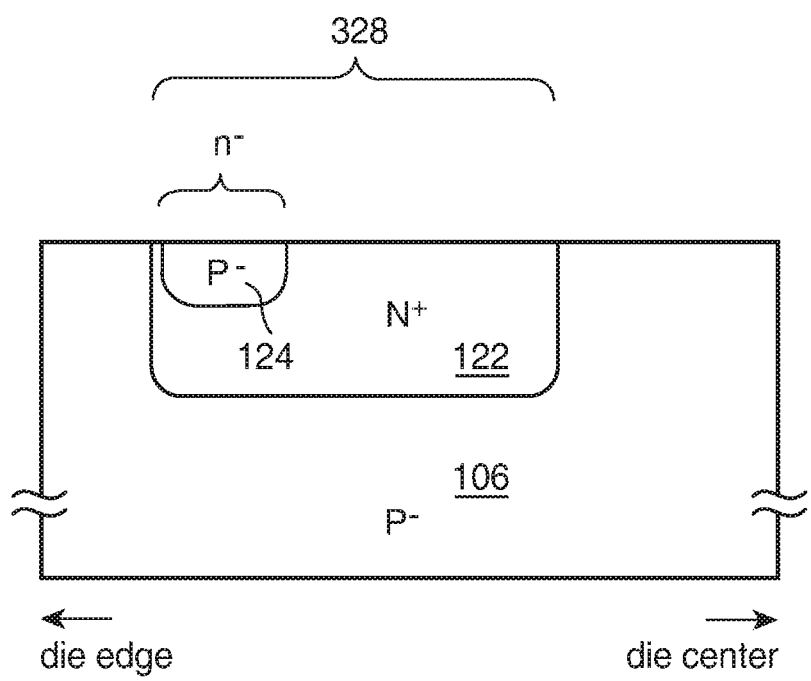
FIG. 3 shows another sample embodiment of the present inventions.

As seen in the sample embodiment of FIG. 3, shallow P-region 124 counterdopes a portion of deep N+ region 122 to simulate an electrically equivalent shallow n-type region in termination structure 328. Shallow simulated-n-type region 124 is most preferably positioned near the outer edge of deep field-limiting-ring 122.

Figure 4:
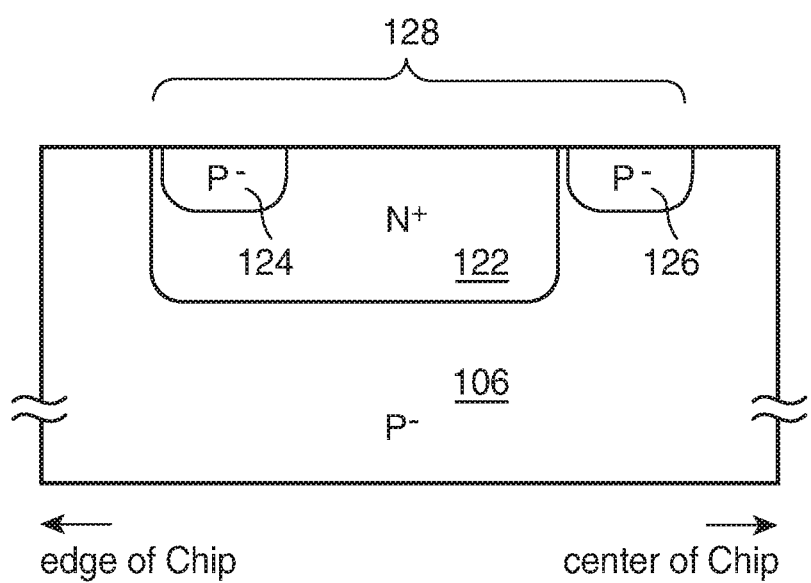
FIG. 4 shows another sample embodiment of the present innovative teachings.

When, as in FIG. 4, this shallow simulated-n-type region 124 is combined with shallow p-type region 126, these two shallow regions 124 and 126 can better mitigate the effects of both positive and negative interface charge on deeper field-limiting ring 122. The dopant profile of the corresponding shallow p-type base contact regions can be adjusted as necessary to provide the net charge required for shallow regions 124 and 126 to optimally increase the breakdown voltage in the termination region.

Figure 2A:
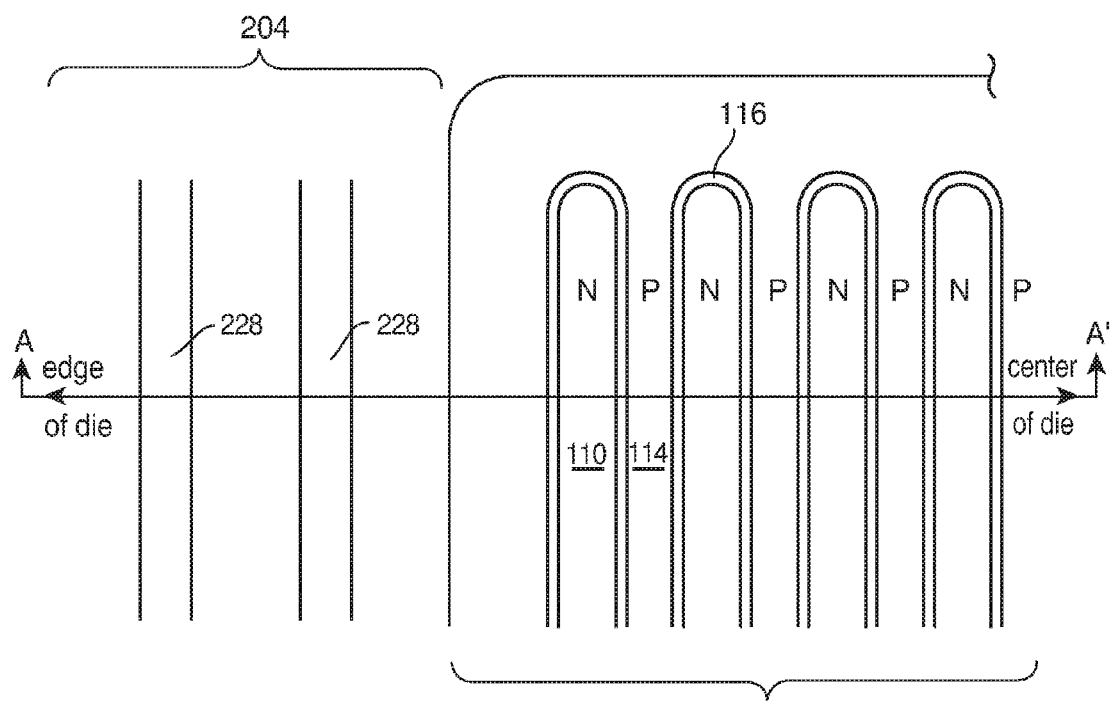
FIGS. 2A and 2B show an overhead view and a cross-section, respectively, of one sample embodiment of the present inventions.
Figure 2B:
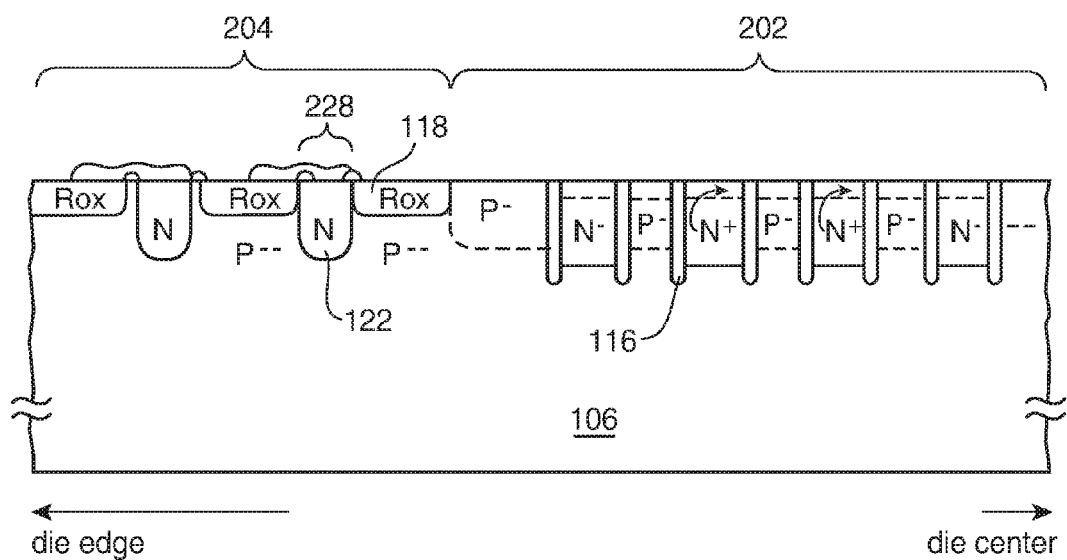

In the overhead view of the sample embodiment shown in FIG. 2A, stripes of N-type emitter regions 110 in active area 202 are each surrounded by poly-filled trench ring 116, and are separated by base contact regions 114. Termination region 204 includes multiple termination rings 228. In the cross-sectional view along line A-A' of FIG. 2B, termination rings 228 are shown in only partial detail, but can be any of the termination ring structures taught herein.

In presently-preferred embodiments, each termination ring and its associated depletion region can drop approximately e.g. 100-150 V.

Figure 5:
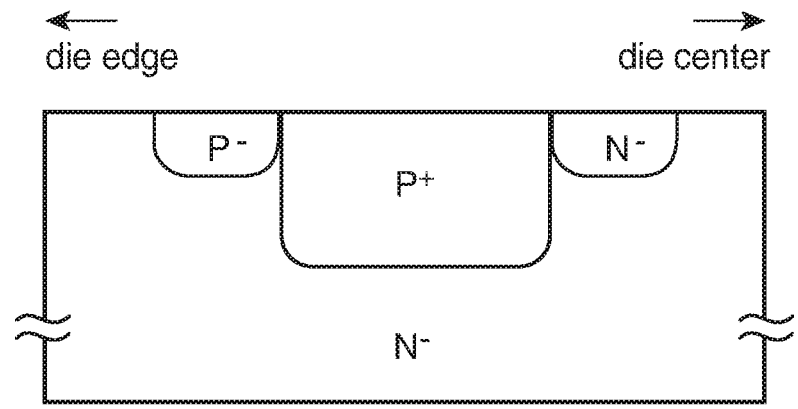
FIGS. 5 and 6 show two prior art termination structures.
Figure 6:
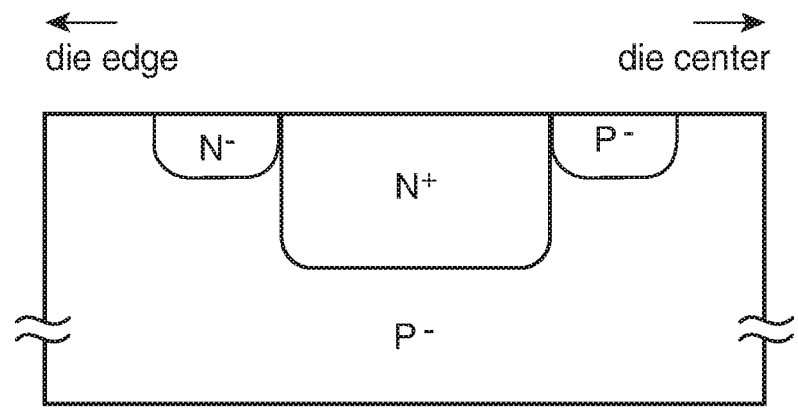
Figure 10A:
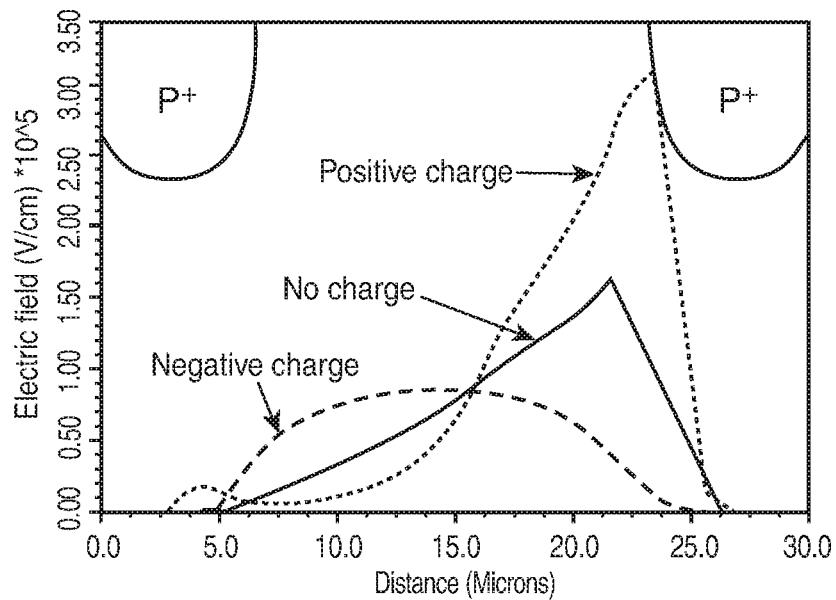
FIGS. 10A and 10B show prior art simulations of electric field distributions.
Figure 10B:
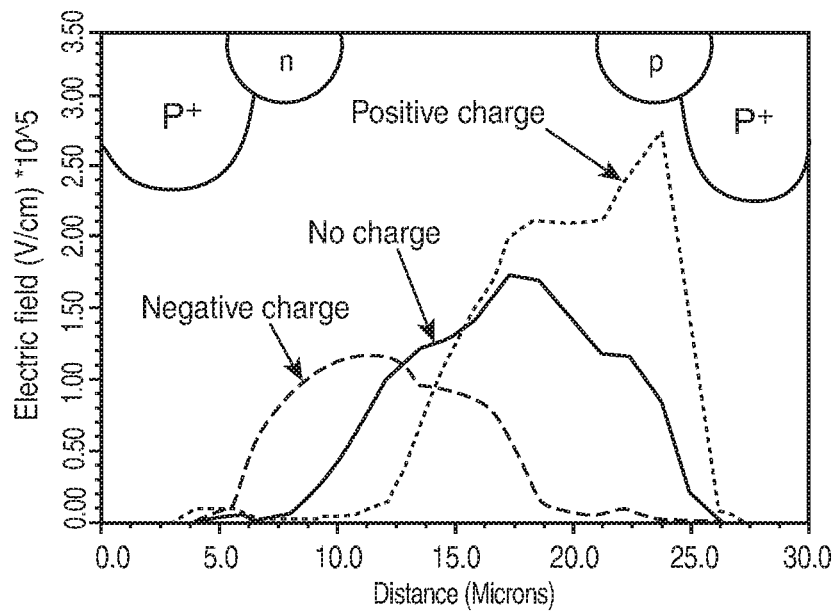

FIG. 5 shows the field-limiting ring structure proposed by Trajkovic, and FIG. 6 shows an analogous structure for a p-type substrate. FIGS. 10A and 10B show Trajkovic's simulations of electric field distribution at the breakdown between two adjacent termination rings without and with the modification proposed by Trajkovic, respectively. Both FIGS. 10A and 10B show the electric field distributions in the cases of positive charge, negative charge, and no charge in the oxide.

Figure 7:
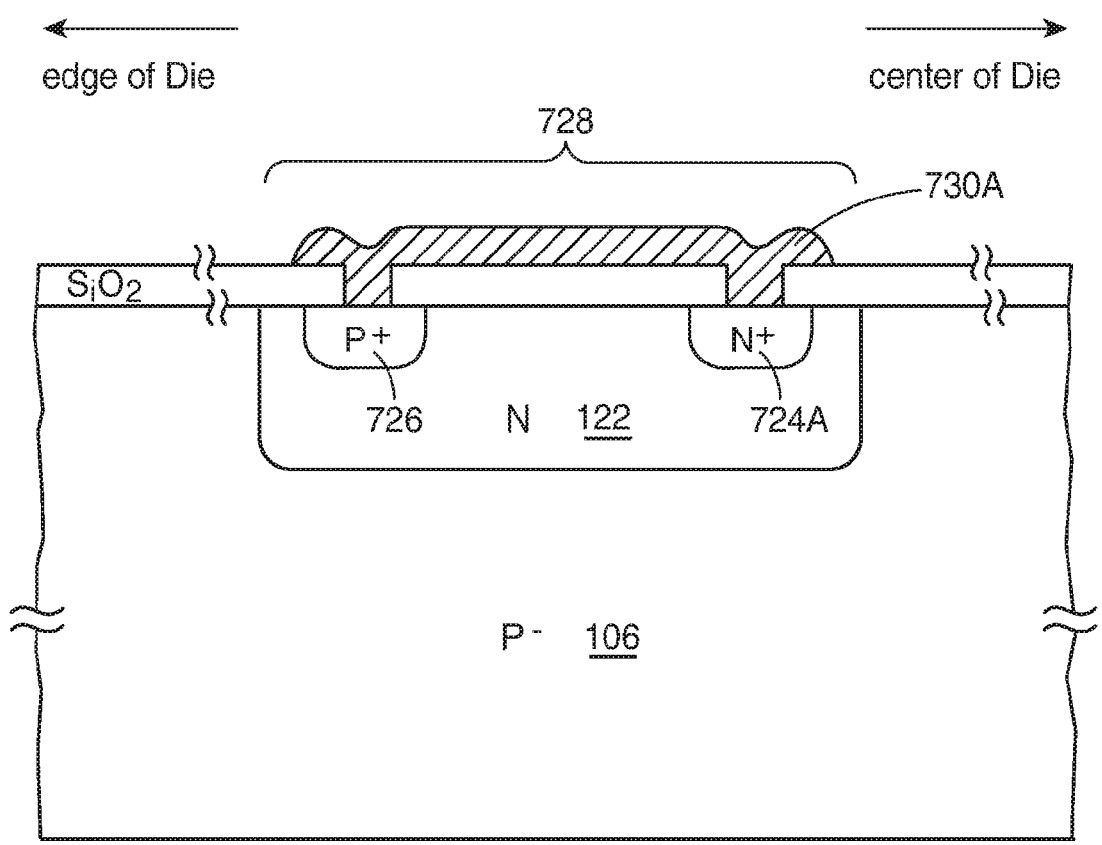
FIG. 7 shows another sample embodiment of the present inventions.

In FIG. 7, termination structure 728 shows another sample embodiment of the present inventions. Here, instead of a lightly-doped p-type region which counterdopes deep N region 122 to simulate an n-type region, shallow N+ region 724A is preferably formed in the same diffusion as the shallow n-type emitter contact regions (not shown). Shallow n-type region 724A and shallow p-type region 726 are both formed on the surface of deep N region 122, and are most preferably electrically connected together by metallization 730A, which helps to spread out the field drop spatially. Metallization 730A can also extend beyond the outer edge of N region 122 to form a field plate (not shown) similar to those in FIG. 1.

Figure 8:
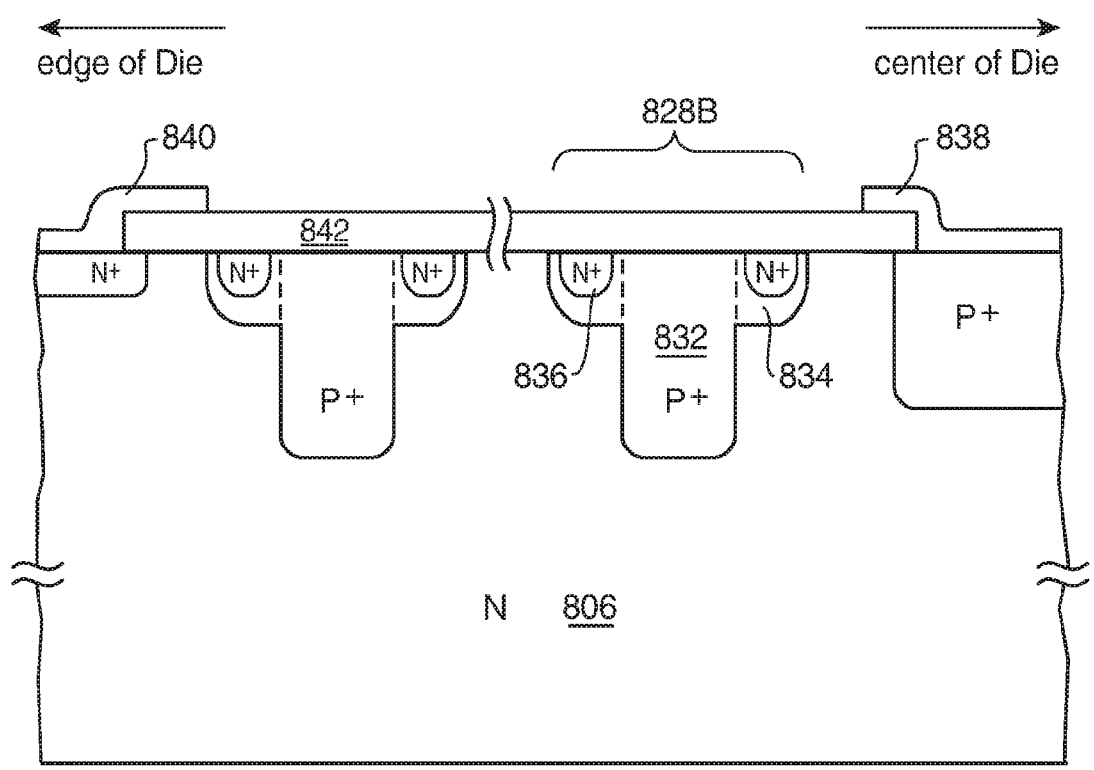
FIG. 8 shows another sample embodiment of the present inventions.
Figure 9A:
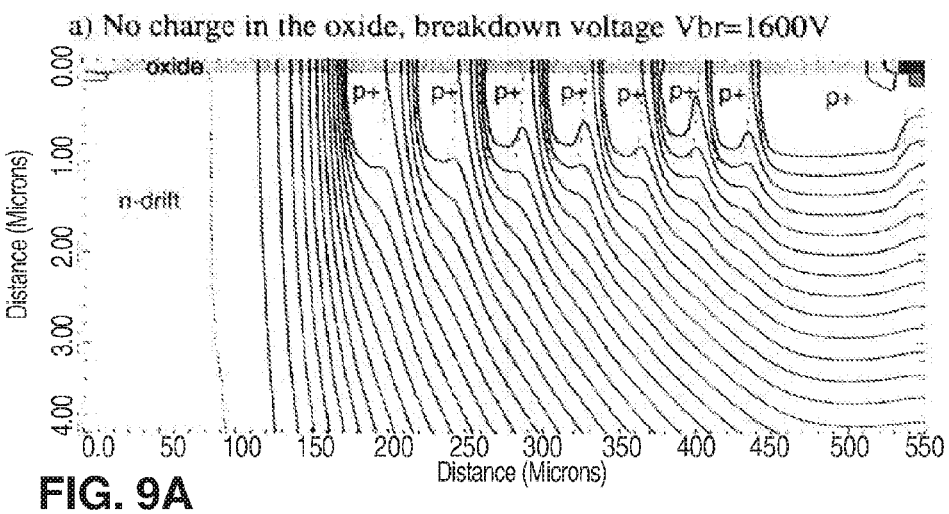
FIGS. 9A, 9B, and 9C show prior art simulations of breakdown voltage.
Figure 9B:
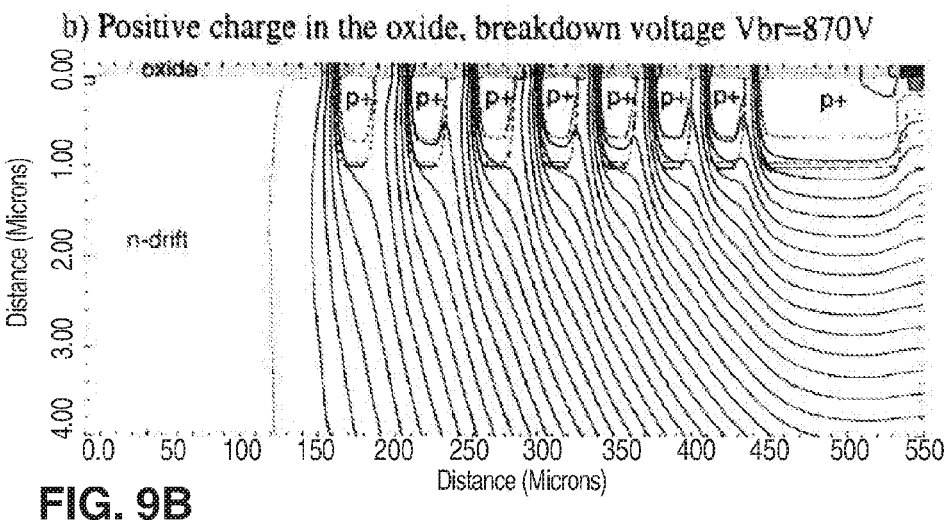
Figure 9C:
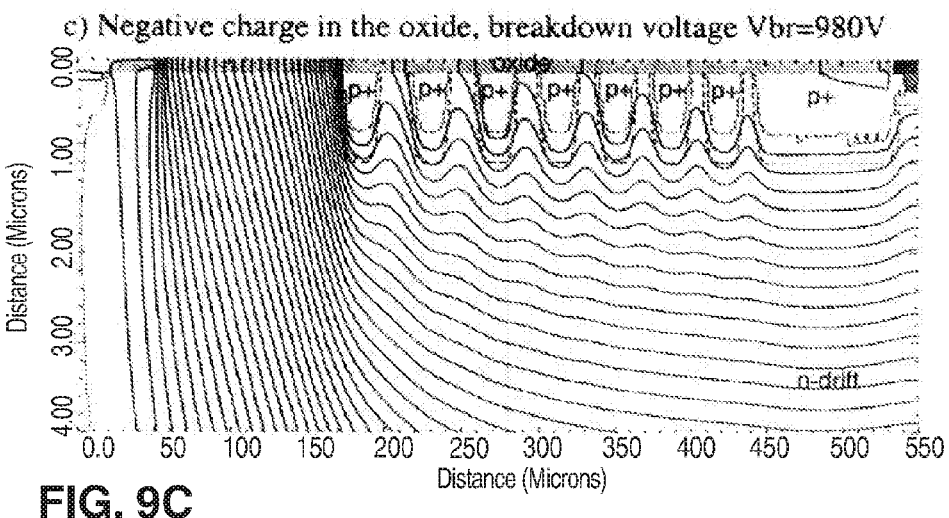
Figure 11:
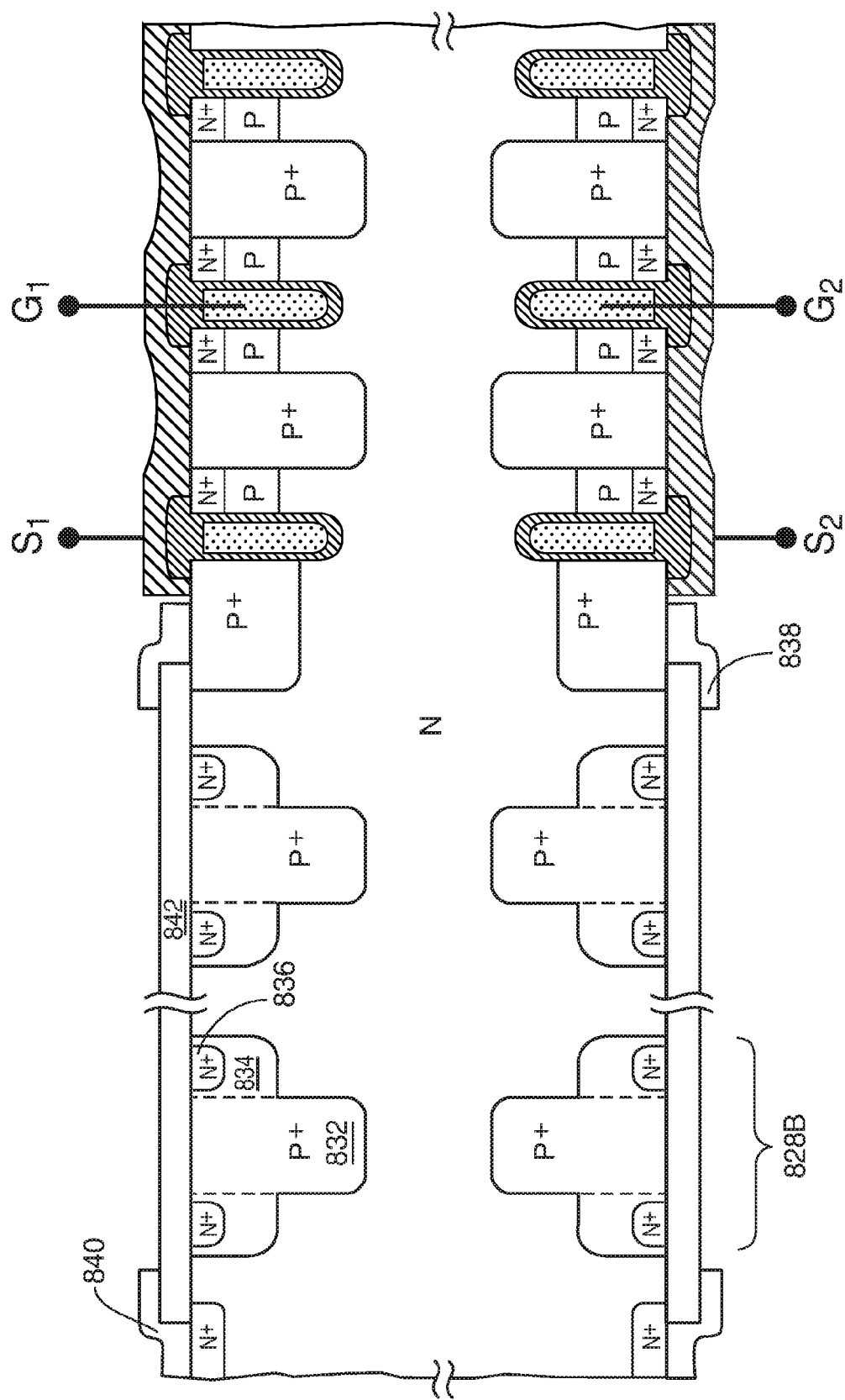
FIG. 11 shows another sample embodiment of the present inventions.

FIG. 8 shows a presently-less-preferred sample embodiment of the present inventions. Termination structure 828B is formed on n-type substrate 806, and parallels the source-body configuration of an IGBT. Deep P+ region 832 parallels the body contact region of an re-channel IGBT. Shallower, more-lightly-doped p-type regions 834 flank deep P+ region 832 on either side, analogous to the body regions of an re-channel IGBT. Inside each of body-analogous regions 834 is shallow N+diffusion 836, which is analogous to the source regions of an n-channel IGBT. Field plate 838 marks the boundary between the active region and the termination region, while field plate 840 marks the boundary between the termination region and the edge of the die. Portions of both field plate 838 and field plate 840 overlay portions of thick field oxide 842. The sample embodiment of FIG. 11 shows termination structure 828B integrated with a bidirectional IGBT, again mimicking the source-body configuration thereof.

Advantages

The disclosed innovations, in various embodiments, provide one or more of at least the following advantages. However, not all of these advantages result from every one of the innovations disclosed, and this list of advantages does not limit the various claimed inventions.

Improved protection from interfacial oxide charge;
Simple integration with existing fabrication processes;
Low net dopant density is achieved in sensitive surface locations, without use of additional doping steps;
Surface rings of both conductivity types help to interrupt both of the breakdown enhancements which can result from different polarities of electrostatic charge.

According to some but not necessarily all embodiments, there is provided: The present application provides (in addition to more broadly applicable inventions) improvements which are particularly applicable to two-sided power semiconductor devices which use bipolar conduction. In this class of devices, the inventor has realized that two or three of the four (or more) semiconductor doping components which form the carrier-emission structures and control structures in the active device (array) portion of a two-sided power device can also be used, with surprising advantages, to form field-limiting rings around the active arrays on both surfaces. Most preferably, in some but not necessarily all embodiments, a shallow implant of one conductivity type is used to counterdope the surface of a well having the other conductivity type. This shallow implant, singly or in combination with another shallow implant of the same conductivity type, works to shield the well from the effects of excess charge at or above the surface of the semiconductor material.

According to some but not necessarily all embodiments, there is provided: A semiconductor device comprising: first and second charge-carrier emission structures on first and second opposed faces of a semiconductor die; first and second semiconductor control regions which are located on said first and second faces respectively, and are each positioned to control emission of first-polarity charge-carriers from said first and said second emission structures respectively; a first field-limiting ring structure, on said first face, which laterally surrounds said first emission structure; a second field-limiting ring structure, on said second face, which laterally surrounds said second emission structure; wherein said first emission structure and said first control structure collectively include at least three doping components, including shallow p-type and n-type components, which each have the same profile as a corresponding respective doping component of said second field-limiting ring, and also includes at least one other doping component which does not have the same profile as any component of said second field-limiting ring; and wherein said second emission structure and said second control structure collectively include at least three doping components, including shallow p-type and n-type components, which each have the same profile as a corresponding respective doping component of said first field-limiting ring, and also includes at least one other doping component which does not have the same profile as any component of said first field-limiting ring; whereby said field-limiting rings, in combination, smooth lateral voltage profiles between said emission structures and an edge of the die.

According to some but not necessarily all embodiments, there is provided: A semiconductor device comprising: first and second charge-carrier emission structures on first and second opposed faces of a semiconductor die; first and second semiconductor control regions which are located on said first and second faces respectively, and are each positioned to control emission of first-polarity charge-carriers from said first and said second emission structures respectively; a first field-limiting ring structure, on said first face, which laterally surrounds said first emission structure; a second field-limiting ring structure, on said second face, which laterally surrounds said second emission structure; wherein said first emission structure and said first control structure collectively include at least three doping components, including shallow p-type and n-type components and a deep well component, which each have the same profile as a corresponding respective doping component of said second field-limiting ring, and also includes at least one other doping component which does not have the same profile as any component of said second field-limiting ring; and wherein said second emission structure and said second control structure collectively include at least three doping components, including shallow p-type and n-type components and a deep well component, which each have the same profile as a corresponding respective doping component of said first field-limiting ring, and also includes at least one other doping component which does not have the same profile as any component of said first field-limiting ring; a first field plate on said first face which is electrically connected to the deep well component of said first field-limiting ring, and which is capacitively coupled through an intervening dielectric layer to some, but not all, of the portion of the semiconductor die which laterally adjoins a portion of said first field-limiting ring; a second field plate on said second face which is electrically connected to the deep well component of said second field-limiting ring, and which is capacitively coupled through and intervening dielectric layer to some, but not all, of the portion of the semiconductor die which laterally adjoins a portions of said second field-limiting ring; whereby said field-limiting rings, in combination, smooth lateral voltage profiles between said emission structures and an edge of the die.

According to some but not necessarily all embodiments, there is provided: A semiconductor device comprising: first and second charge-carrier emission structures on first and second opposed faces of a semiconductor die; first and second semiconductor control regions which are located on said first and second faces respectively, and are each positioned to control emission of first-polarity charge-carriers from said first and said second emission structures respectively; a first field-limiting ring structure, on said first face, which laterally surrounds said first emission structure; a second field-limiting ring structure, on said second face, which laterally surrounds said second emission structure; wherein said first emission structure and said first control structure collectively include at least three doping components, including shallow p-type and n-type components, which each have the same spatial profile as, and are electrically equivalent to, a corresponding respective doping component of said second field-limiting ring, and also includes at least one other doping component which does not have the same profile as any component of said second field-limiting ring; and wherein said second emission structure and said second control structure collectively include at least three doping components, including shallow p-type and n-type components, which each have the same spatial profile as, and are electrically equivalent to, a corresponding respective doping component of said first field-limiting ring, and also includes at least one other doping component which does not have the same profile as any component of said first field-limiting ring; whereby said field-limiting rings, in combination, smooth lateral voltage profiles between said emission structures and an edge of the die.

According to some but not necessarily all embodiments, there is provided: A semiconductor device comprising: a charge-carrier emission structure on a first face of a semiconductor die; a semiconductor control region positioned to control emission of first-polarity charge-carriers from said emission structure; one or more field-limiting ring structures which laterally surround said emission structure; wherein said emission structure and said control region collectively include at least three doping components, including shallow p-type and n-type components, which each have the same profile as a corresponding respective doping component of said field-limiting rings, and also includes at least one other doping component which does not have the same profile as any component of said field-limiting rings; and whereby said field-limiting rings smooth lateral voltage profiles between said emission structure and an edge of the die.

According to some but not necessarily all embodiments, there is provided: A semiconductor device comprising: first and second charge-carrier emission structures on first and second opposed faces of a semiconductor die; first and second gate control structures which are located on said first and second faces respectively, and are each positioned to control emission of first-polarity charge-carriers from said first and said second emission structures respectively; a first field-limiting ring structure, on said first face, which laterally surrounds said first emission structure; a second field-limiting ring structure, on said second face, which laterally surrounds said second emission structure; wherein said first emission structure and said first gate control structure include at least three doping components, including shallow p-type and n-type components, which each have the same profile as a corresponding respective doping component of said second field-limiting ring, and also include at least one component which does not have the same profile as any component of said second field-limiting ring, and which is capacitively coupled to at least one of the doping components having the same profile as a corresponding respective doping component of said second field-limiting ring; and wherein said second emission structure and said second gate control structure include at least three doping components, including shallow p-type and n-type components, which each have the same profile as a corresponding respective doping component of said first field-limiting ring, and also includes at least one component which does not have the same profile as any component of said first field-limiting ring, and which is capacitively coupled to at least one of the doping components having the same profile as a corresponding respective doping component of said first field-limiting ring; whereby said field-limiting rings, in combination, smooth lateral voltage profiles between said emission structures and an edge of the die.

According to some but not necessarily all embodiments, there is provided: A method of operating a power semiconductor device, comprising: selectably, in response to drive on a first control terminal on a first face of a semiconductor die, emitting or not emitting first-polarity charge-carriers from a first emission structure, to thereby initiate bipolar conduction of electric current in a first direction; selectably, in response to drive on a second control terminal on a second face of the semiconductor die, emitting or not emitting first-polarity charge-carriers from a second emission structure on said second face, to thereby initiate bipolar conduction of electric current opposite to said first direction; laterally spreading the voltage of said first emission structure across multiple first field-limiting rings which laterally surround said first emission structures; laterally spreading the voltage of said second emission structure across multiple second field-limiting rings which laterally surround said second emission structure; wherein each said first field-limiting ring includes at least three semiconductor doping components which each have the same profile as a respective doping component of said second emission structure; and wherein each said second field-limiting ring includes at least three semiconductor doping components which each have the same profile as a respective doping component of said first emission structure.

Modifications and Variations

As will be recognized by those skilled in the art, the innovative concepts described in the present application can be modified and varied over a tremendous range of applications, and accordingly the scope of patented subject matter is not limited by any of the specific exemplary teachings given. It is intended to embrace all such alternatives, modifications and variations that fall within the spirit and broad scope of the appended claims.

In some alternative embodiments, termination regions can include more than one type of field-limiting ring, including one or more conventional field-limiting rings or other conventional termination structures.

In some alternative embodiments, a two-sided device can have vertically-asymmetric termination regions.

In some alternative embodiments, the innovative termination structures of the instant application can be used with other two-sided devices, or with one-sided devices, by mimicking portions of the carrier emission and control structures thereof.

In some alternative embodiments, one or more field plates can be placed between each active region and the respective termination region.

In some alternative embodiments, one or more field plates can be placed between the end of a termination region and the edge of the die.

In one alternative embodiment like that of FIG. 8, p-type region 834 and N+ region 836 are only on the outer perimeter of P+ regions 832.

In some embodiments, field plates are metal. In other embodiments, field plates can be polysilicon. In still other embodiments, other conductive or semiconducting materials can be used.

In some contemplated embodiments, two or more field plates can be placed between adjacent termination rings. In other contemplated embodiments, field plates can be omitted between some or all of the termination rings.

In some embodiments, field plates can extend outwards from a respective termination structure toward the edge of the die. In other embodiments, field plates can extend inwards from a respective termination structure toward the center of the die. In still other embodiments, this can be different.

In some alternative counterdoping embodiments, a shallow diffusion of the conductivity type being simulated can still be used to make contact from any field plate to the deep portion of a field-limiting ring.

In one alternative embodiment like that of FIG. 1, field plates extending outwards from the deep termination ring are interspersed around the ring with metallizations which electrically connect the two associated shallow diffusions.

While the present innovations are primarily discussed herein with respect to p-type substrates, it will of course be understood that adaptations to n-type substrates can be realized by swapping dopant polarities.

Additional general background, which helps to show variations and implementations, can be found in the following publications, all of which are hereby incorporated by reference: Trajkovic, T., et al. "The effect of static and dynamic parasitic charge in the termination area of high voltage devices and possible solutions," The 12th International Symposium on Power Semiconductor Devices and ICs, Proceedings, pp. 263-266, May 22-25, 2000, IEEE.

Additional general background, which helps to show variations and implementations, as well as some features which can be implemented synergistically with the inventions claimed below, may be found in the following US patent applications. All of these applications have at least some common ownership, copendency, and inventorship with the present application, and all of them, as well as any material directly or indirectly incorporated within them, are hereby incorporated by reference: U.S. Pat. Nos. 8,406,265, 8,400,800, 8,395,910, 8,391,033, 8,345,452, 8,300,426, 8,295,069, 7,778,045, 7,599,196; US 2012-0279567 A1, US 2012-0268975 A1, US 2012-0274138 A1, US 2013-0038129 A1, US 2012-0051100 A1; PCT/U514/16740, PCT/US14/26822, PCT/US14/35954, PCT/US14/35960; Ser. Nos. 14/182,243, 14/182,236, 14/182,245, 14/182,246, 14/183,403, 14/182,249, 14/182,250, 14/182,251, 14/182,256, 14/182,268, 14/183,259, 14/182,265, 14/183,415, 14/182,280, 14/183,422, 14/182,252, 14/183,245, 14/183,274, 14/183,289, 14/183,309, 14/183,335, 14/183,371, 14/182,270, 14/182,277, 14/207,039, 14/209,885, 14/260,120, 14/265,300, 14/265,312, 14/265,315, 14/313,960, 14/479,857, 14/514,878, 14/514,988, 14/515,348, and all priority applications of any of the above thereof, each and every one of which is hereby incorporated by reference.

None of the description in the present application should be read as implying that any particular element, step, or function is an essential element which must be included in the claim scope: THE SCOPE OF PATENTED SUBJECT MATTER IS DEFINED ONLY BY THE ALLOWED CLAIMS. Moreover, none of these claims are intended to invoke paragraph six of 35 USC section 112 unless the exact words "means for" are followed by a participle.

The claims as filed are intended to be as comprehensive as possible, and NO subject matter is intentionally relinquished, dedicated, or abandoned.

What is claimed is:

1. A semiconductor device comprising:
   first and second charge-carrier emission structures on first and second opposed faces of a semiconductor die;
   first and second semiconductor control regions which are located on said first and second faces respectively, and are each positioned to control emission of first-polarity charge-carriers from said first and said second emission structures respectively;
   a first field-limiting ring structure, on said first face, which laterally surrounds said first emission structure;
   a second field-limiting ring structure, on said second face, which laterally surrounds said second emission structure;
   wherein said first emission structure and said first control region collectively include at least three doping components, including shallow p-type and n-type components, which each have the same spatial profile as, and are electrically equivalent to, a corresponding respective doping component of said second field-limiting ring structure, and also includes at least one other doping component which does not have the same profile as any component of said second field-limiting ring structure; and
   wherein said second emission structure and said second control region collectively include at least three doping components, including shallow p-type and n-type components, which each have the same spatial profile as, and are electrically equivalent to, a corresponding respective doping component of said first field-limiting ring structure, and also includes at least one other doping component which does not have the same profile as any component of said first field-limiting ring structure;
   whereby said field-limiting ring structures, in combination, smooth lateral voltage profiles between said emission structures and an edge of the die;
   wherein the shallow p-type and n-type components of the field-limiting ring structures are electrically connected through a local metallization portion which is not connected to said emission structures nor said control regions, and wherein said local metallization is capacitively coupled to some, but not all, of the portion of the semiconductor die which laterally separates adjacent ones of said field-limiting ring structures.

2. A semiconductor device comprising:
   a charge-carrier emission structure on a first face of a semiconductor die;
   a semiconductor control region positioned to control emission of first-polarity charge-carriers from said emission structure;
   one or more field-limiting ring structures which laterally surround said emission structure;

wherein said emission structure and said control region collectively include at least three doping components, including shallow p-type and n-type components, which each have the same profile as a corresponding respective doping component of said one or more field-limiting ring structures, and also includes at least one other doping component which does not have the same profile as any component of said one or more field-limiting ring structures; and whereby said one or more field-limiting ring structures smooth lateral voltage profiles between said emission structure and an edge of the die.

3. The device of claim 2, wherein the bulk of the semiconductor die is lightly doped p-type material, and each said field-limiting ring structure includes an n-type well.

4. The device of claim 2, wherein the bulk of the semiconductor die is lightly doped p-type material, and each said field-limiting ring structure includes an n-type well, and the shallow n-type component in each said field-limiting ring structure is electrically simulated by a second p-type component counterdoping the respective n-type well.

5. The device of claim 2, wherein the bulk of the semiconductor die is silicon.

6. The device of claim 2, wherein the shallow p-type and n-type components of the one or more field-limiting ring structures are electrically connected through metallization.

7. The device of claim 2, wherein the shallow p-type and n-type components of the one or more field-limiting ring structures are electrically connected through a local metallization portion which is not connected to said emission structure nor said control region.

8. The device of claim 2, wherein said one or more field-limiting structures comprise a plurality of adjacent field-limiting ring structures; and wherein the shallow p-type and n-type components of the field-limiting ring structures are electrically connected through a local metallization portion which is not connected to said emission structure nor said control region, and wherein said local metallization is capacitively coupled to some, but not all, of the portion of the semiconductor die which laterally separates adjacent ones of said field-limiting ring structures.

9. A semiconductor device comprising:

first and second charge-carrier emission structures on first and second opposed faces of a semiconductor die;

first and second gate control structures which are located on said first and second faces respectively, and are each positioned to control emission of first-polarity charge-carriers from said first and said second emission structures respectively;

a first field-limiting ring structure, on said first face, which laterally surrounds said first emission structure;

a second field-limiting ring structure, on said second face, which laterally surrounds said second emission structure;

wherein said first emission structure and said first gate control structure include at least three doping components, including shallow p-type and n-type components, which each have the same profile as a corresponding respective doping component of said second field-limiting ring structure, and also include at least one component which does not have the same profile as any component of said second field-limiting ring structure, and which is capacitively coupled to at least one of the doping components having the same profile as a corresponding respective doping component of said second field-limiting ring structure; and wherein said second emission structure and said second gate control structure include at least three doping components, including shallow p-type and n-type components, which each have the same profile as a corresponding respective doping component of said first field-limiting ring structure, and also includes at least one component which does not have the same profile as any component of said first field-limiting ring structure, and which is capacitively coupled to at least one of the doping components having the same profile as a corresponding respective doping component of said first field-limiting ring structure;

whereby said field-limiting ring structures, in combination, smooth lateral voltage profiles between said emission structures and an edge of the die.

10. The device of claim 9, wherein the bulk of the semiconductor die is lightly doped p-type material, and each said field-limiting ring structure includes an n-type well.

11. The device of claim 9, wherein the bulk of the semiconductor die is lightly doped p-type material, and each said field-limiting ring structure includes an n-type well, and the shallow n-type component in each said field-limiting ring structure is electrically simulated by a second p-type component counterdoping the respective n-type well.

12. The device of claim 9, wherein the bulk of the semiconductor die is silicon.

13. The device of claim 9, further comprising at least one local metallization portion which is not connected to said emission structures nor said control structures, and wherein said local metallization is capacitively coupled to some, but not all, of the portion of the semiconductor die which laterally separates adjacent ones of said field-limiting ring structures.

\* \* \* \* \*